(12) United States Patent
Eilert et al.

(10) Patent No.: US 8,015,473 B2
(45) Date of Patent: Sep. 6, 2011

(54) METHOD, SYSTEM, AND APPARATUS FOR ECC PROTECTION OF SMALL DATA STRUCTURES

(75) Inventors: Sean S. Eilert, Penryng, CA (US); Peter Leung, Port Coquitlam (CA); Rich Fackenthal, Carmichael, CA (US)

(73) Assignee: Intel Corporation, Santa Clara, CA (US)

( * ) Notice: Subject to any disclaimer, the term of this patent is extended or adjusted under 35 U.S.C. 154(b) by 1295 days.

(21) Appl. No.: 11/642,906

(22) Filed: Dec. 19, 2006

(65) Prior Publication Data

US 2008/0148126 A1   Jun. 19, 2008

(51) Int. Cl.
  *G11C 29/00* (2006.01)
(52) U.S. Cl. ........................ 714/773; 714/774
(58) Field of Classification Search ............ 714/755, 714/773, 774
See application file for complete search history.

(56) References Cited

U.S. PATENT DOCUMENTS

| | | | |
|---|---|---|---|
| 5,961,660 A | 10/1999 | Caapps, Jr. et al. | |
| 6,651,212 B1 * | 11/2003 | Katayama et al. | 714/763 |
| 6,747,827 B1 | 6/2004 | Bassett et al. | |
| 6,961,890 B2 | 11/2005 | Smith | |
| 7,146,555 B2 | 12/2006 | Sasaki | |
| 7,389,465 B2 * | 6/2008 | Radke et al. | 714/755 |
| 7,395,488 B2 * | 7/2008 | Finkelstein et al. | 714/763 |

OTHER PUBLICATIONS

Intel, "Migration Guide for Intel StrataFlash Wireless Memory (L18) to Intel StrataFlash Cellular Memory (M18)", Application Note 822, Oct. 2006, pp. 22.
Intel, "Intel StrataFlash Cellular Memory (M18)", Developer's Manual, Nov. 2006, pp. 64.
Korean Patent Office, International Search Report and Written Opinion for International Application No. PCT/US2007/084367, 10 pages, Feb. 21, 2008.

* cited by examiner

*Primary Examiner* — Stephen M Baker
(74) *Attorney, Agent, or Firm* — Trop, Pruner & Hu, P.C.

(57) ABSTRACT

Data structures of different sizes may be stored in memory using different ECC schemes. A memory device may include multiple ECC engines to support error correction operations on different sized data structures.

18 Claims, 6 Drawing Sheets

METHOD, SYSTEM, AND APPARATUS FOR ECC PROTECTION OF SMALL DATA STRUCTURES

FIELD

Embodiments described herein relate to the use of Error Control Code (ECC) for memory devices, and more specifically, to the use of multiple ECC schemes in a nonvolatile memory device.

BACKGROUND

Memory architectures that utilize on-chip ECC often have limitations. For example, flash memory solutions employing large page ECC (e.g. 256 bit) may have re-write limitations. Flash memory solutions that use pseudo-single-bit per cell (PSBC) may have reliability limitations. PSBC is capable of correcting small shifts in the programmed state of any cell, but is not capable of correcting large shifts.

Phase change memory (PCM) utilizing ECC may be limited by the endurance of the parity cells.

BRIEF DESCRIPTION OF THE DRAWINGS

A better understanding of embodiments of the present invention can be obtained from the following detailed description in conjunction with the following drawings, in which.

DETAILED DESCRIPTION

In the following description, for purposes of explanation, numerous details are set forth in order to provide a thorough understanding of embodiments of the present invention. However, it will be apparent to one skilled in the art that these specific details are not required in order to practice the present invention as hereinafter claimed. For example, although some embodiments are described with respect to flash memory devices, embodiments may also be applicable to other types of memory, including, but not limited to bit alterable memories, such as phase change memory. Also, although specific memory sizes are mentioned herein, it should be understood that these are examples for the purpose of illustration only, and that larger or smaller memory sizes, buffer sizes, bus or interconnect widths, etc., may also be used in other embodiments.

In the following description and claims, the terms "include" and "comprise," along with their derivatives, may be used, and are intended to be treated as synonyms for each other. In addition, in the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still cooperate or interact with each other.

A memory array may be comprised of memory cells capable of storing one or more bits per cell. The memory array may be configured as follows. The array may be divided into a plurality of partitions. In some embodiments, the array may be divided into eight partitions. The size of a partition may depend upon the size of the memory device. Each partition may be divided further into a plurality of blocks. Each block may be 256 kilobytes (KB) in size. Each block may be further divided into 1 KB programming regions, and each region may be subdivided into thirty-two 32 byte (256 bit) segments.

As used herein, "object mode" is defined as a programming mode that provides the ability for a system to write large amounts of data (e.g. 1 KB) to a memory array at once. In object mode, the system may write to each 1 kilobyte (KB) region of memory only once between block erase cycles.

As used herein, "control mode" is defined as a programming mode that provides the ability for a system to write small data fragments to a memory array. In some embodiments, the small data fragments may be four bit "nibbles." In control mode, each nibble is initially erased, and has a data value of 1111b (0xF). The value of the nibble may be programmed to any value between 0x0 and 0xE inclusive, and may be written to multiple times between block erase cycles. Thus, in control mode, the memory is bit alterable.

Data may be written to a memory array in either control mode or object mode, depending on the type of data being stored.

Figure 1:
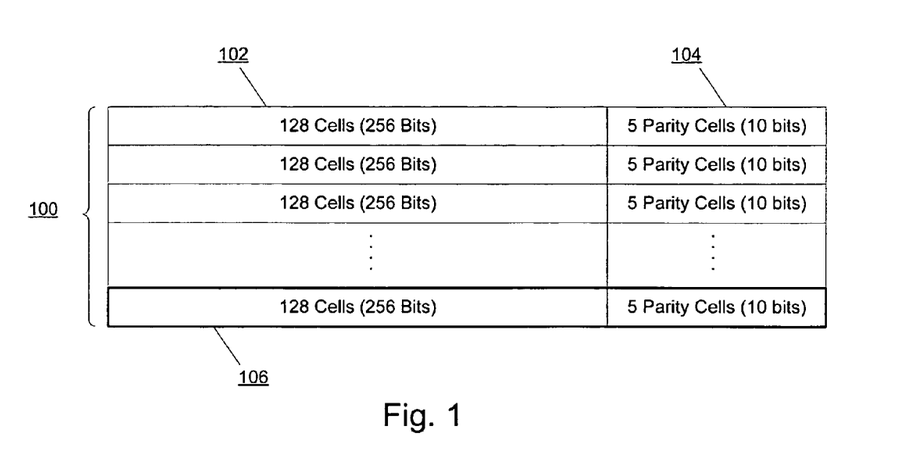
FIG. 1 is an illustration of a memory block programmed in object mode.

FIG. 1 illustrates a portion of memory (100) that has been programmed in object mode according to some embodiments. In some embodiments, the portion of memory may be part of an array of nonvolatile memory cells. The portion of memory (100) may, for example, be a 1 KB programming region that is subdivided into thirty-two codewords (106). Each codeword (106) includes a user data portion (102) and a parity portion (104). In some embodiments, the user data may be 256 bits in length. In a multi-level cell (MLC) memory array, the 256 bits of user data may be stored in 128 cells. The parity data may be 10 bits in length, and in a multi-level cell memory array, may be stored in 5 cells.

The ECC scheme used to generate the parity cells (104) in object mode may be a quaternary ECC scheme capable of detecting and/or correcting at least one cell error per 133 cell codeword (106).

In some embodiments, the portion of memory (100) programmed in object mode may be programmed simultaneously to minimize coupling effects.

Figure 2:
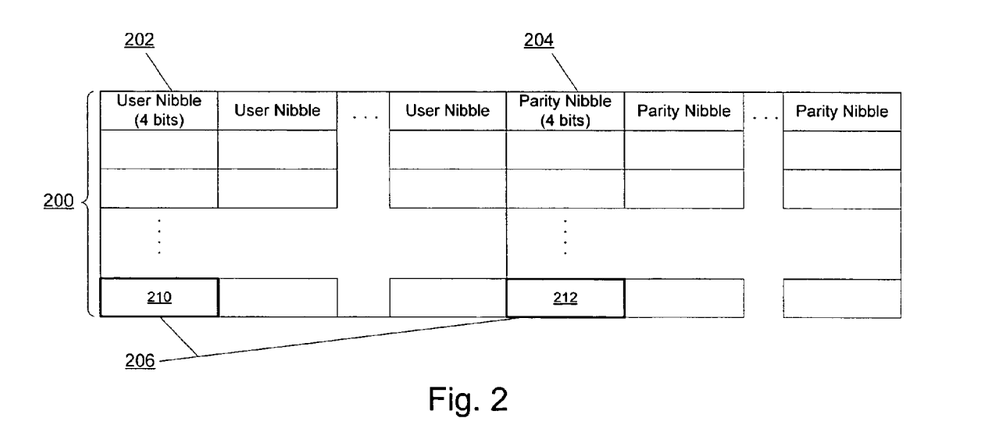
FIG. 2 is an illustration of a memory block programmed in control mode.

FIG. 2 illustrates a portion of memory (200) that has been programmed in control mode according to some embodiments. In some embodiments, the portion of memory may be part of an array of nonvolatile memory cells. The portion of memory (200) may be a programming region that is subdivided into two portions: a region for user data stored as 4-bit nibbles (202), and a region for associated parity data (208). In some embodiments, the portion of memory may be a 1 KB programming region that is divided into 512 bytes of user data storage (202) and 512 bytes of parity data storage (204). The user and parity regions are further subdivided into user nibbles (210) and parity nibbles (212). A four bit user nibble may be stored in two cells in a multi-level cell memory array. The corresponding four bit parity nibble may also be stored in two cells in a multi-level cell memory array. Each user nibble (210) and its corresponding parity nibble (212) comprise one codeword in control mode.

The ECC scheme used to generate the parity cells (204) in control mode may be a quaternary ECC scheme capable of detecting and/or correcting at least one cell error per 4 cell codeword (206).

In some embodiments, each nibble (202) in the portion of memory (200) programmed in control mode may be programmed separately. ECC may be used to compensate for errors caused due to coupling effects during cell programming.

Thus, a large data value (e.g. codeword 106) may be written to a memory array using an ECC scheme capable of correcting at least one cell error in the large data value, as illustrated in FIG. 1. Additionally, a smaller data value (e.g. codeword 206) may be written to the memory array using an ECC scheme capable of correcting at least one cell error in the smaller data value, as illustrated in FIG. 2. The large data value and/or the small data value may subsequently be read from the memory array. At the time each respective data value is read, error detection and/or correction may be performed using an appropriate ECC scheme to detect and/or correct at least one cell error per large data value or one cell error per small data value.

Figure 3:
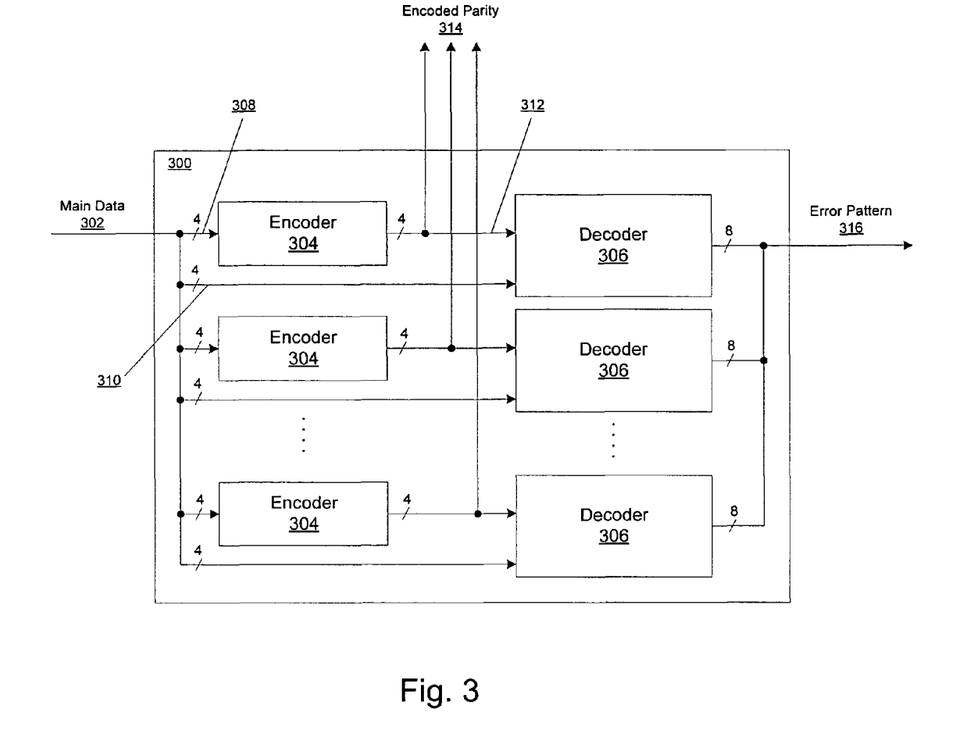
FIG. 3 is a block diagram illustrating an ECC engine for small data values.

FIG. 3 is block diagram of an ECC engine (300) to detect and/or correct errors in small data values, such as nibbles, as described with respect to FIG. 2, above. For ease of description, this will be referred to as a "nibble ECC engine," however, it should be recognized that it may be modified to accommodate other sizes of data values in addition to or instead of nibble size data values.

The nibble ECC engine (300) includes one or more encoders (304) and one or more decoders (306).

In some embodiments, the encoder (304) is a nibble encoder, to encode four parity bits (314) based on four user bits (308) included in main user data (302) that is to be written to the memory array. During encoding, the main user data may include a total of 128 user bits to be programmed into nonvolatile memory cells. Parity for each nibble of user data may be separately encoded by one of the encoders (304). The encoded parity bits (314) may then be written to the memory array along with the main user data.

In some embodiments, the decoder (306) is a nibble decoder, to decode the expected parity bits (312) and received parity bits (310) from the main data (302). The decoder may then provide an error pattern (316) to be used for error detection and/or error correction purposes. During decoding, the main data (302) may include 128 user bits and 128 parity bits read from the nonvolatile memory array.

Figure 4:
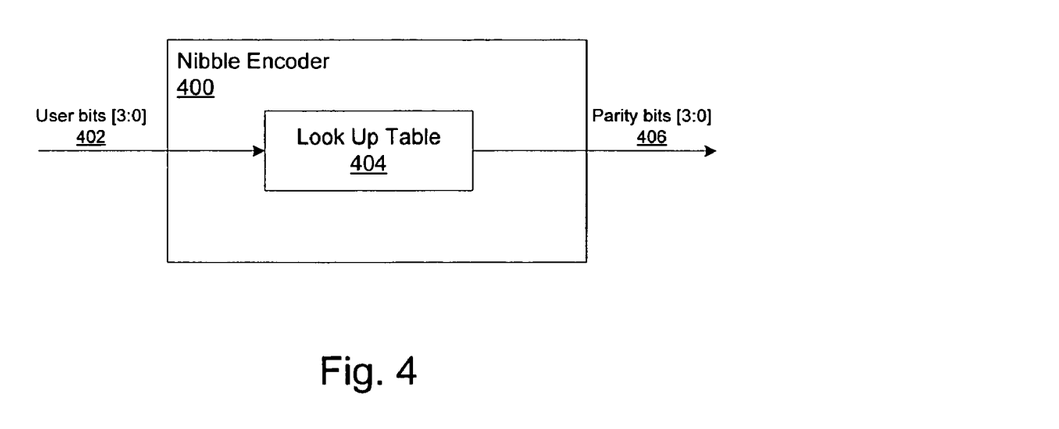
FIG. 4 is a block diagram illustrating a nibble ECC encoder.

FIG. 4 is a block diagram of a nibble encoder, such as the encoder (304) of FIG. 3, according to some embodiments. The input to the nibble encoder (400) is one nibble of user-input data (402). For a quaternary encoding scheme, a look up table (404) may be used to encode the four parity bits (406). In some embodiments, the look up table may be a 16×4 look up table. In other embodiments, a matrix multiplier may be used for encoding, in place of a look up table.

One possible encoding scheme for the nibble encoder is illustrated in Table 1, below. Many other encoding schemes are possible as well. Using any of the possible quaternary encoding schemes for a two bit per cell memory, any single failing cell in a group of four cells can be corrected.

TABLE 1

| User Nibble | Parity Nibble |
|---|---|
| 00 | 00 |
| 01 | 32 |
| 02 | 13 |
| 03 | 21 |
| 10 | 23 |
| 11 | 11 |
| 12 | 30 |
| 13 | 02 |
| 20 | 31 |
| 21 | 03 |
| 22 | 22 |
| 23 | 10 |
| 30 | 12 |
| 31 | 20 |
| 32 | 01 |
| 33 | 33 |

In some embodiments, as in the embodiment illustrated in Table 1, the encoding scheme will have parity data that matches the user data for more than one codeword. For example, as shown in Table 1, the user data matches the parity data for codewords 0000, 1111, 2222, and 3333.

Figure 5:
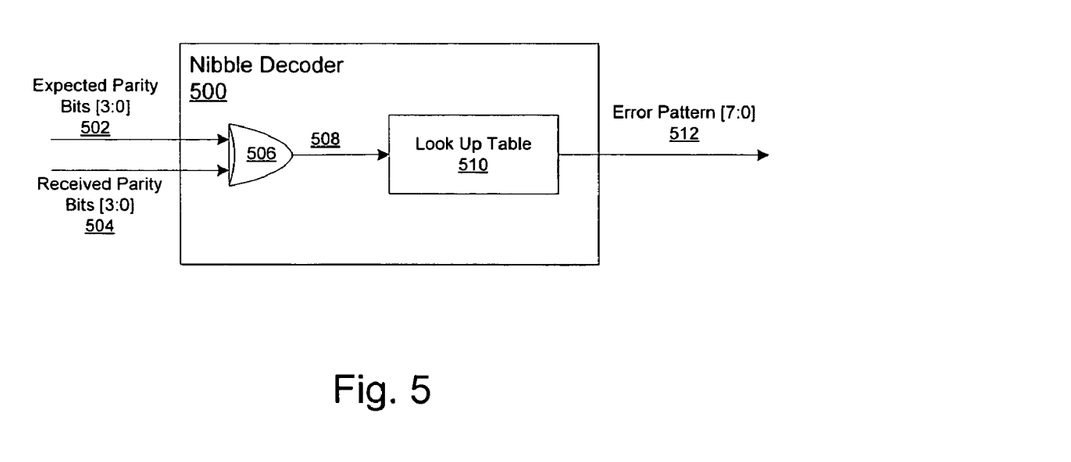
FIG. 5 is a block diagram illustrating a nibble ECC decoder.

FIG. 5 is a block diagram of a nibble decoder, such as the decoder (306) of FIG. 3, according to some embodiments. The inputs to the nibble decoder (500) include an expected parity nibble (502) and a received parity nibble (504). The expected parity nibble is determined by encoding the user nibble read from the memory array. An XOR operation (506) is performed on the expected parity nibble (502) and the received parity nibble (504). The result of the XOR operation is a four bit syndrome (508). A look up table (510) may be used to determine an error pattern (512) based on the syndrome (508). In some embodiments, the look up table (510) may be a 16×8 look up table. The error pattern (512) may be an 8 bit error pattern, including 4 user bits and 4 parity bits. Any bit in the error pattern (512) having a value of one indicates that that bit in the codeword read from the array contains an error. To correct the error, the bit that is in error may be flipped.

Figure 6:
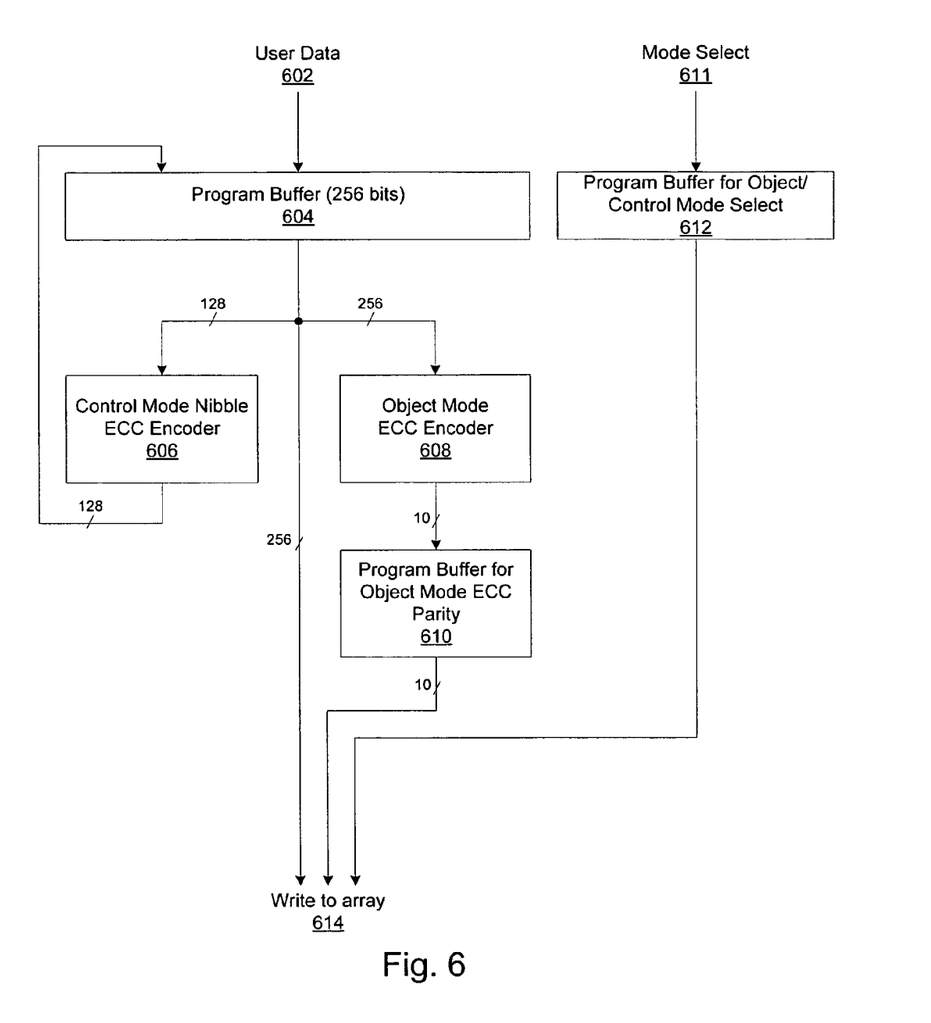
FIG. 6 is a block diagram illustrating a write path for a device having object mode and control mode ECC capability.

FIG. 6 is a block diagram of a write path for a memory device having object mode and control mode ECC capability according to some embodiments. The user data (602) may be written in either object mode or control mode, as described above with respect to FIGS. 1 and 2. The mode may be selected by the user or system, and may be indicated by a mode select signal (611). A program buffer (612) may be used to store the object/control mode select to be written to the array.

For user data (602) that is to be written in object mode, 256 bits of user data may be written to the program buffer (604). Parity bits for the user data may then be encoded using an object mode ECC encoder (608). The object mode ECC encoder will encode 10 parity bits to be used to detect and/or correct at least one error per 256 bits of user data. The object mode ECC parity bits will then be stored in a program buffer (610). The user data (602) and parity bits may then be written to the memory array (614). The mode select bit (611) may also be written to the memory array to indicate the mode to be used for error correction.

When user data (602) is to be written in control mode, 128 bits of user data may be written into the program buffer (604). Parity bits for the user data may then be encoded using a control mode ECC encoder (606). The control mode ECC encoder (606), such as the encoder of FIG. 4, will encode one parity nibble per user nibble to be used to detect and/or correct at least one error per nibble of user data. The encoded parity data may then be stored in the program buffer (604). When the parity data has been encoded, the user data and parity data may be written to the memory array (614).

Figure 7:
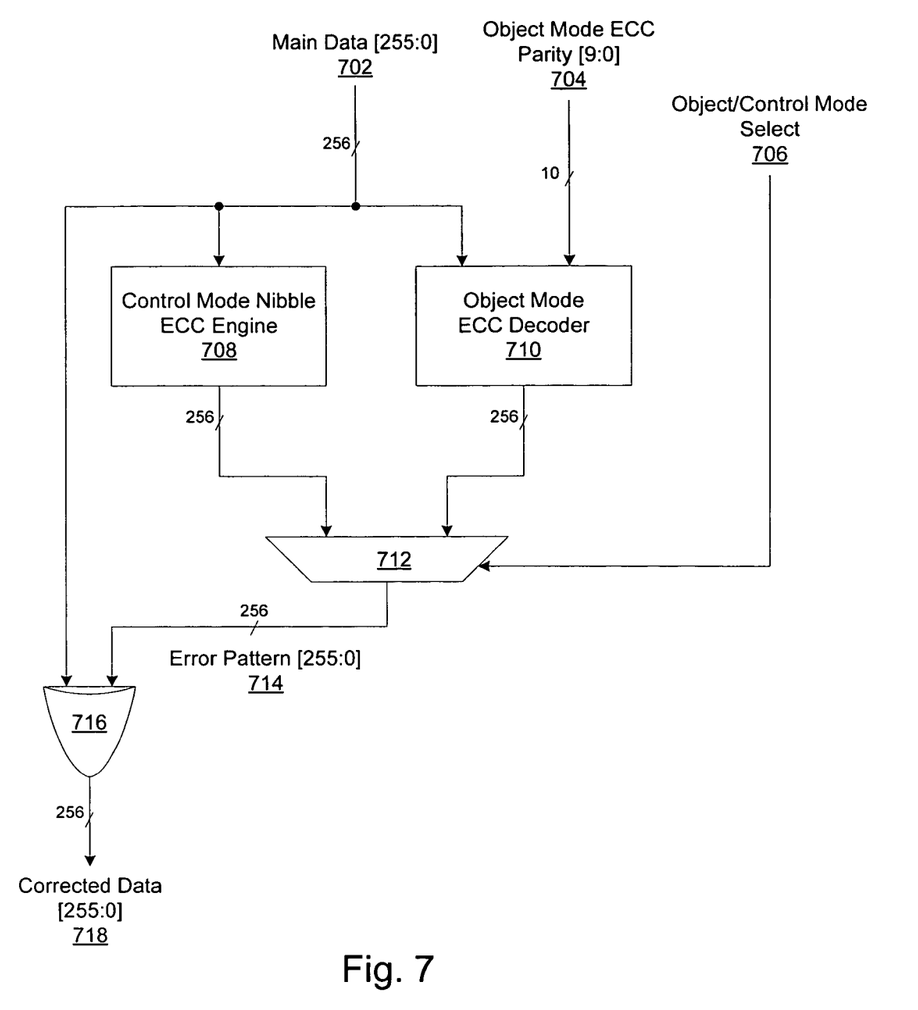
FIG. 7 is a block diagram illustrating a read path for a device having object mode and control mode ECC capability.

FIG. 7 is a block diagram of a read path for a memory device having object mode and control mode ECC capability according to some embodiments. The main data (702) read from the array may have been previously written in either object mode or control mode, as described above with respect to FIGS. 1 and 2. Depending on the mode, it is necessary to use the proper ECC decoding scheme. This may be determined using an object/control mode select signal (706) which may be read from the memory array. The mode select signal (706) will determine which of two multiplexed error patterns (712), object mode or control mode, to use in performing error correction.

In object mode, 256 bits of user data may be read from the array (702). In addition, 10 parity bits (704) may be read from the array. The object mode ECC decoder (710) will generate an error pattern based on the main data (702) and the parity bits (704). An XOR correction operation (716) may then be performed on the error pattern and the main data (702) to generate a 256 bit corrected data value (718).

In control mode, 256 bits of data may be read from the array. These 256 bits include both 128 bits of user data and 128 parity bits. Each nibble of user data has an associate nibble of parity data, as described above. The control mode nibble ECC engine (708) operates on the user data and parity data as described above with respect to FIGS. 3-5 to generate an error pattern. An XOR correction operation (716) may then be performed on the error pattern and the main data (702) to generate a corrected data value (718). In control mode, only 128 bits of the corrected data value will be valid user data. The remaining 128 bits will consist of the parity bits stored in the array.

Figure 8:
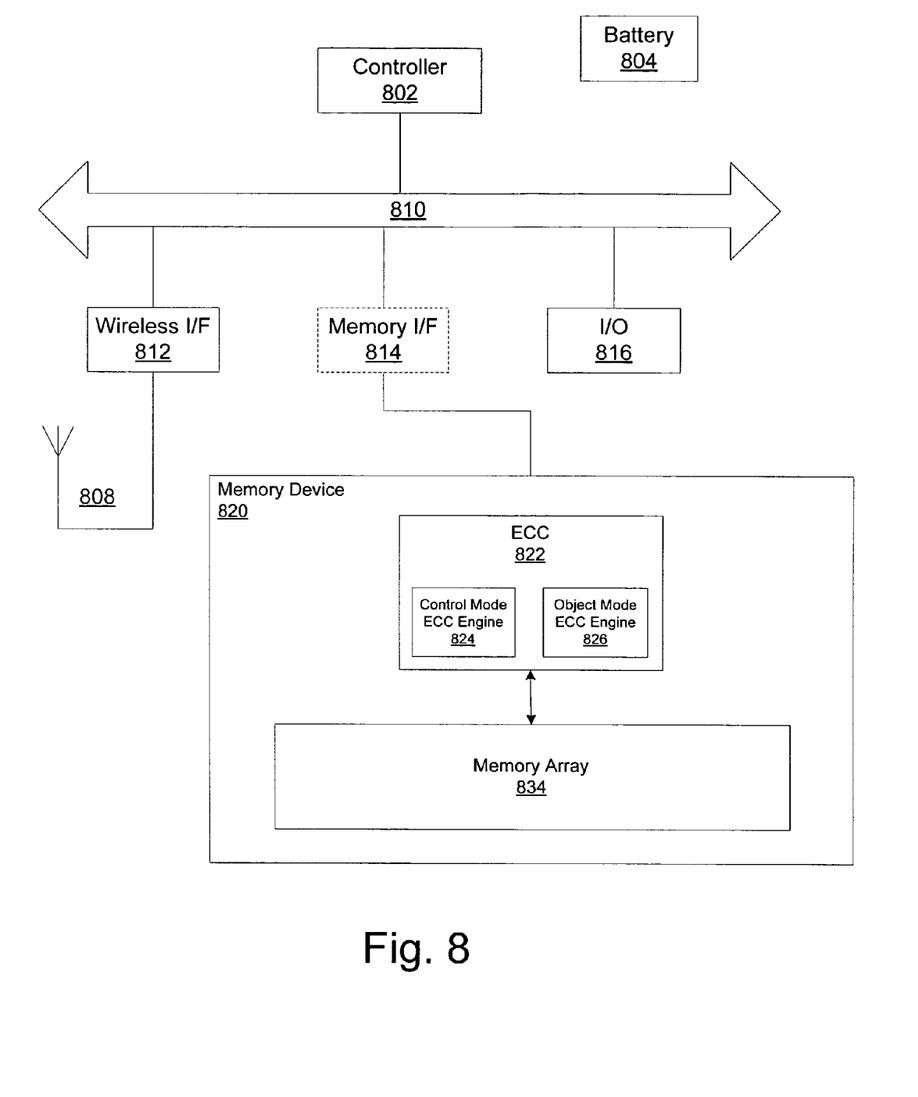
FIG. 8 is a system block diagram.

FIG. 8 is a block diagram of a system according to one embodiment. The system may include a controller (802) which communicates via an interconnect (810). The controller (802) may be a microcontroller, one or more microprocessors, a multi-core microprocessor, a digital signal processor (DSP), or another type of controller. The system may be powered by a battery (804) or may be powered with another power source, such as AC power.

A variety of input/output (I/O) devices (816) may be coupled to the interconnect (810). The I/O devices may include items such as a display, keyboard, mouse, touch screen, or other I/O devices. A wireless network interface (812) may also be coupled to the interconnect (810). The wireless interface (812) may enable cellular or other wireless communication between the system and other devices. In one embodiment, the wireless interface (812) may include a dipole antenna.

The system also includes a memory device (820) capable of supporting ECC. The memory device may be a nonvolatile memory device, such as, but not limited to, a flash memory device or a phase change memory device. The memory device may be built into the system, or may be part of a removable storage medium, such as a card form factor, that may be inserted into an optional flash card interface or other type of interface (814).

The memory device (820) may include a memory array (834) and ECC logic (822) coupled to the array. The memory device may include other elements as well, however, those components are not illustrated here for ease of understanding. The ECC logic may include both a control mode ECC engine (824) and an object mode ECC engine (826). The control mode ECC engine (824) may include one or more nibble encoders and nibble decoders, as described above with respect to FIGS. 3-7. The object mode ECC engine (826) may include one or more 256 bit ECC encoders and decoders, to generate 10 parity bits for each 256 bits of user data and to detect/correct at least one bit per 256 bits of user data, as described above with respect to FIGS. 6-7.

In some embodiments, the memory array may be an array of multi-level memory cells capable of storing two or more bits per cell.

Thus, a method, apparatus, and system for ECC protection of small data structures are disclosed in various embodiments. In the above description, numerous specific details are set forth. However, it is understood that embodiments may be practiced without these specific details. In other instances, well-known circuits, structures, and techniques have not been shown in detail in order not to obscure the understanding of this description. Embodiments have been described with reference to specific exemplary embodiments thereof. It will, however, be evident to persons having the benefit of this disclosure that various modifications and changes may be made to these embodiments without departing from the broader spirit and scope of the embodiments described herein. The specification and drawings are, accordingly, to be regarded in an illustrative rather than a restrictive sense.

We claim:

1. An apparatus comprising:
   a memory array;
   a first error correcting code (ECC) engine coupled to the memory array to perform ECC encoding and ECC decoding for data structures of a first size; and
   a second ECC engine coupled to the memory array to perform ECC encoding and ECC decoding for data structures of a second size, wherein the data structures of the second size are larger than the data structures of the first size and wherein only one of said first and second ECC engines is operable at any time, the first error correcting code engine being operable when data structures of a first size are being written and said second ECC engine being operable when data structures of said second size are being written to the memory array.

2. The apparatus of claim 1, wherein the data structures of the first size are four bits long.

3. The apparatus of claim 2, wherein the data structures of the second size are 256 bits long.

4. The apparatus of claim 1, wherein the memory array is comprised of a plurality of memory cells, each memory cell capable of storing two bits per cell.

5. The apparatus of claim 4, wherein the first ECC engine is capable of correcting one cell error per four cell codeword.

6. The apparatus of claim 5, wherein the first ECC engine is to utilize an encoding scheme having a plurality of codewords, each codeword comprised of a user data value and a parity data value, wherein the user data value matches the parity data value for at least two of the plurality of codewords.

7. The apparatus of claim 5, wherein the second ECC engine is capable of correcting one cell error per 133 cell codeword.

8. A method comprising:
   determining a size of a value to be written to a memory array;
   using a first error correcting code (ECC) scheme if the value is of a first size; and
   using a second ECC scheme if the value is of a second size, said first and second sizes being different.

9. The method of claim 8, wherein the memory array is an array of nonvolatile memory cells.

10. The method of claim 8, wherein writing the value to the memory array using the first ECC scheme comprises writing the value using a control mode.

11. The method of claim 10, wherein the first ECC scheme is a quaternary ECC scheme capable of correcting one cell error per nibble.

12. The method of claim 8, wherein writing the value to the memory array using the second ECC scheme comprises writing the value using an object mode.

13. The method of claim 12, wherein the second ECC scheme is a quaternary ECC scheme capable of correcting one cell error per codeword.

14. A system comprising:
   an interconnect;
   a controller coupled to the interconnect; and
   a memory device coupled to the interconnect, wherein the memory device includes a memory array, a first error correcting code (ECC) engine coupled to the memory array to perform ECC encoding and ECC decoding for data structures of a first size, and a second ECC engine coupled to the memory array to perform ECC encoding and ECC decoding for data structures of a second size, wherein the data structures of the second size are larger than the data structures of the first size and wherein only one of said first and second ECC engines is operable at any time, the first error correcting code engine being operable when data structures of a first size are being written and said second ECC engine being operable when data structures of said second size are being written to the memory array.

15. The system of claim 14, wherein the memory device is a flash memory device and wherein the memory array is comprised of a plurality of memory cells, each memory cell capable of storing two bits per cell.

16. The system of claim 14, wherein the data structures of the first size are four bits long.

17. The system of claim 16, wherein the data structures of the second size are 256 bits long.

18. The system of claim 14, wherein the first ECC engine is capable of correcting one cell error per four cell codeword and the second ECC engine is capable of correcting one cell error per 133 cell codeword.

* * * * *